(12) United States Patent
Liu et al.

(10) Patent No.: US 8,537,547 B2
(45) Date of Patent: Sep. 17, 2013

(54) REPAIR APPARATUS AND METHOD FOR CIRCUIT BOARD ASSEMBLY

(75) Inventors: Yu-Ching Liu, Taipei Hsien (TW);
Chi-An Yu, Taipei Hsien (TW);
Xi-Hang Li, Shenzhen (CN); Bing Liu, Shenzhen (CN); Zhi-Bing Li, Shenzhen (CN); Jie-Peng Kang, Shenzhen (CN); Jing-Bin Liang, Shenzhen (CN); Hai-Gui Huang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 256 days.

(21) Appl. No.: 12/982,813

(22) Filed: Dec. 30, 2010

(65) Prior Publication Data
US 2012/0008284 A1 Jan. 12, 2012

(30) Foreign Application Priority Data

Jul. 7, 2010 (CN) .......................... 2010 1 0219687

(51) Int. Cl.
*H05K 7/20* (2006.01)

(52) U.S. Cl.
USPC ........... 361/692; 361/719; 361/760; 174/252; 174/255; 174/260; 174/547

(58) Field of Classification Search
USPC ....... 361/676–678, 679.46–679.54, 688–692, 361/694, 700–720, 752, 760–761
See application file for complete search history.

(56) References Cited

U.S. PATENT DOCUMENTS

| | | | | |
|---|---|---|---|---|
| 7,515,415 | B2* | 4/2009 | Monfarad et al. | 361/699 |
| 7,551,439 | B2* | 6/2009 | Peugh et al. | 361/699 |
| 8,081,463 | B2* | 12/2011 | Chiu-Mao et al. | 361/702 |
| 8,305,762 | B2* | 11/2012 | Wits et al. | 361/720 |
| 2006/0012034 | A1* | 1/2006 | Kadoya et al. | 257/712 |
| 2006/0065431 | A1* | 3/2006 | Trucco | 174/250 |
| 2006/0146496 | A1* | 7/2006 | Asfia et al. | 361/700 |
| 2006/0171127 | A1* | 8/2006 | Kadoya et al. | 361/752 |
| 2010/0277868 | A1* | 11/2010 | Beaupre et al. | 361/700 |
| 2012/0188717 | A1* | 7/2012 | Albrecht et al. | 361/699 |

* cited by examiner

*Primary Examiner* — Courtney Smith
(74) *Attorney, Agent, or Firm* — Altis Law Group, Inc.

(57) ABSTRACT

A repair apparatus for a circuit board assembly includes a cooling device for a surface of the circuit board assembly opposite to the surface to be repaired. The cooling device defines a chamber for receiving the circuit board assembly. The circuit board assembly is disposed within the chamber to define a heat exchange space between the circuit board assembly and the bottom of the chamber. A method for repairing a circuit board assembly is also provided.

7 Claims, 6 Drawing Sheets

REPAIR APPARATUS AND METHOD FOR CIRCUIT BOARD ASSEMBLY

BACKGROUND

1. Technical Field

The present disclosure relates to repair apparatus, and more particularly to a repair apparatus for circuit board assemblies.

2. Description of Related Art

With industry trends towards continued minimization, circuit board assemblies are increasingly thinner and smaller, with the density of components arranged thereon increasing, such that the electronic components are frequently seated on opposite surfaces of the circuit board.

Repair of such components soldered on the circuit board assemblies is often accomplished by use of a hot air gun. However, when the electronic components to be repaired are heated in this manner, electronic components on the opposite surface of the circuit board assembly are also subjected to the applied heat and may easily suffer damage.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiments of the repair apparatus. Moreover, in the drawings, like reference numerals designate corresponding parts throughout several views.

DETAILED DESCRIPTION

Figure 1:
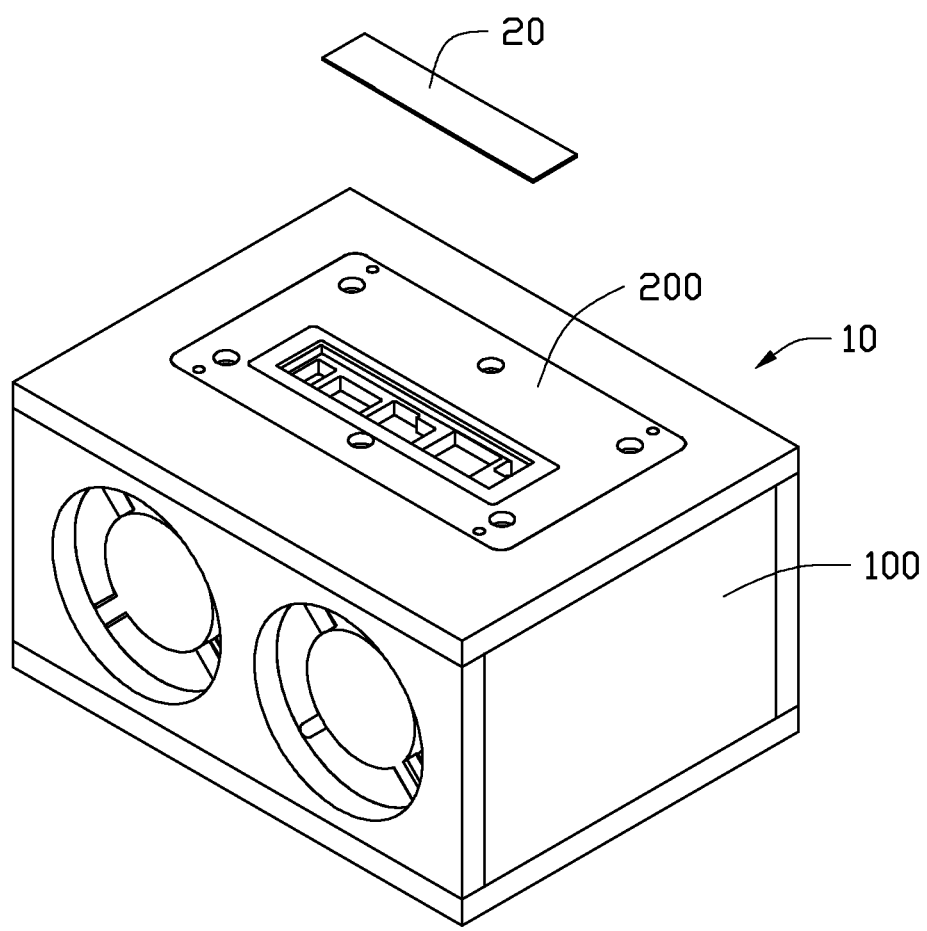
FIG. 1 is a perspective view of a repair apparatus for a circuit board assembly in accordance with one embodiment; the repair apparatus including a housing and a cooling device.

Referring to FIG. 1, a repair apparatus 10 used for a circuit board assembly 20 is shown. The circuit board assembly 20 may be used in portable electronic devices, such as mobile phones and PDAs. The circuit board assembly 20 may be small and thin, as shown by the circuit board assembly 20 in the embodiment measuring at 0.74-0.76 mm. In the embodiment, a plurality of electronic components is soldered onto the opposite surfaces of the circuit board assembly 20. The repair apparatus 10 includes a housing 100 and a cooling device 200 disposed in the housing 100. The cooling device 200 cools an opposite surface of the circuit board assembly 20 when a primary surface of the circuit board assembly 20 is heated by a hot gun during repair, such that the electronic components mounted on the opposite surface of the circuit board assembly 20 are protected from the heating process.

Figure 2:
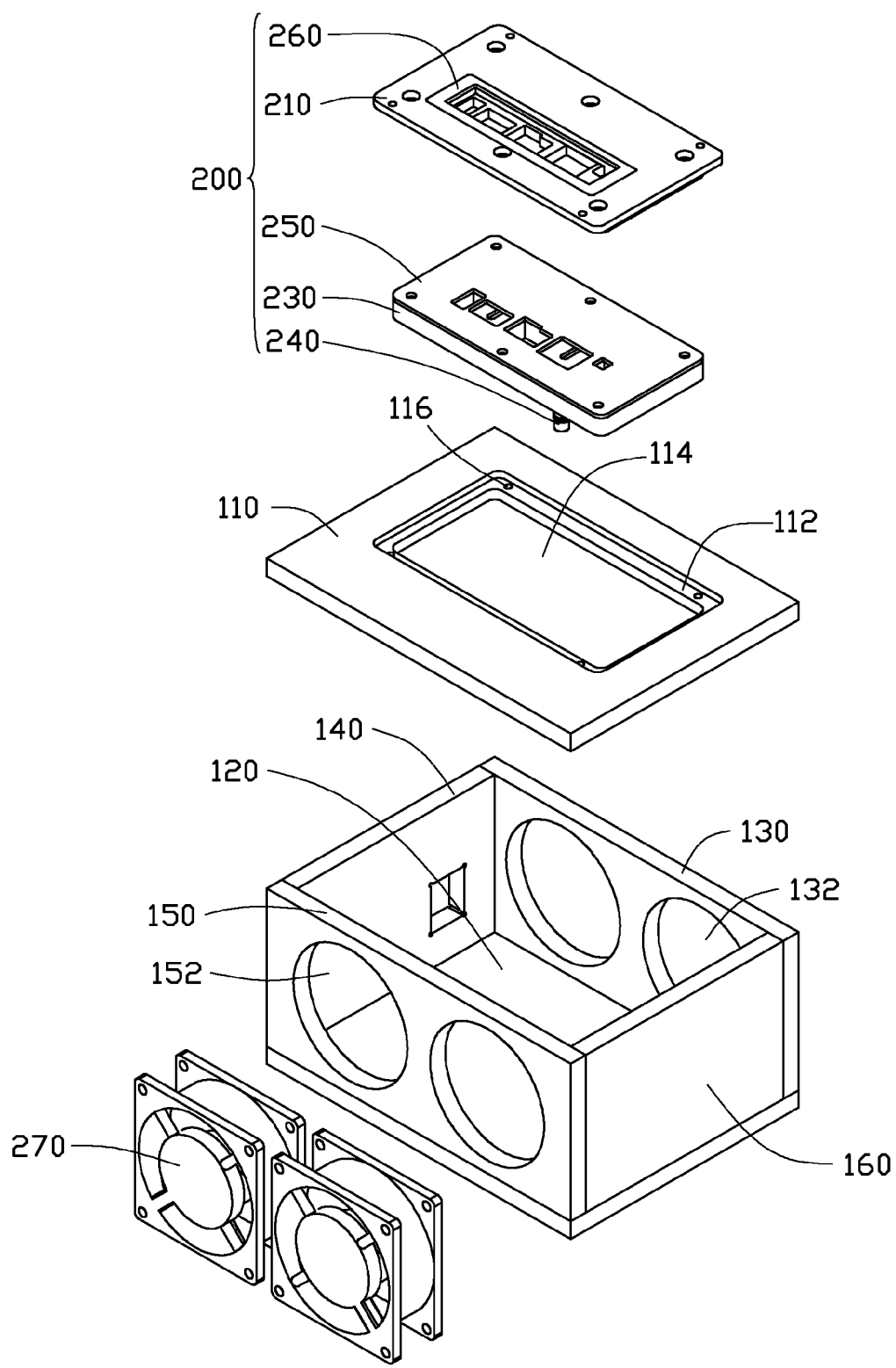
FIG. 2 is a partially exploded view of the repair apparatus in FIG. 1.

Referring to FIG. 2, the housing 100 includes a cover 110, a bottom surface 120 and four sidewalls (hereinafter, a first sidewall 130, a second sidewall 140, a third sidewall 150 and a fourth sidewall 160). The four sidewalls 130, 140, 150 and 160 are based on four sides of the bottom surface 120 respectively, and are serially interconnected. The cover 110 is mounted on the upper sides of the four sidewalls 130, 140, 150 and 160. The outer surface of the cover 110 defines a first recess 112. The bottom of the first recess 112 defines a first opening 114, and a plurality of first fixing holes 116. The fixing holes 116 are arranged around the first opening 114. The first sidewall 130 defines two first holes 132, and the third sidewall 150 opposite to the first sidewall 130 defines two second holes 152 corresponding to the first holes 132. Thus, cooling air can flow into the housing 100 via the first holes 132 and flow out of the housing 100 via the second holes 152.

Figure 3:
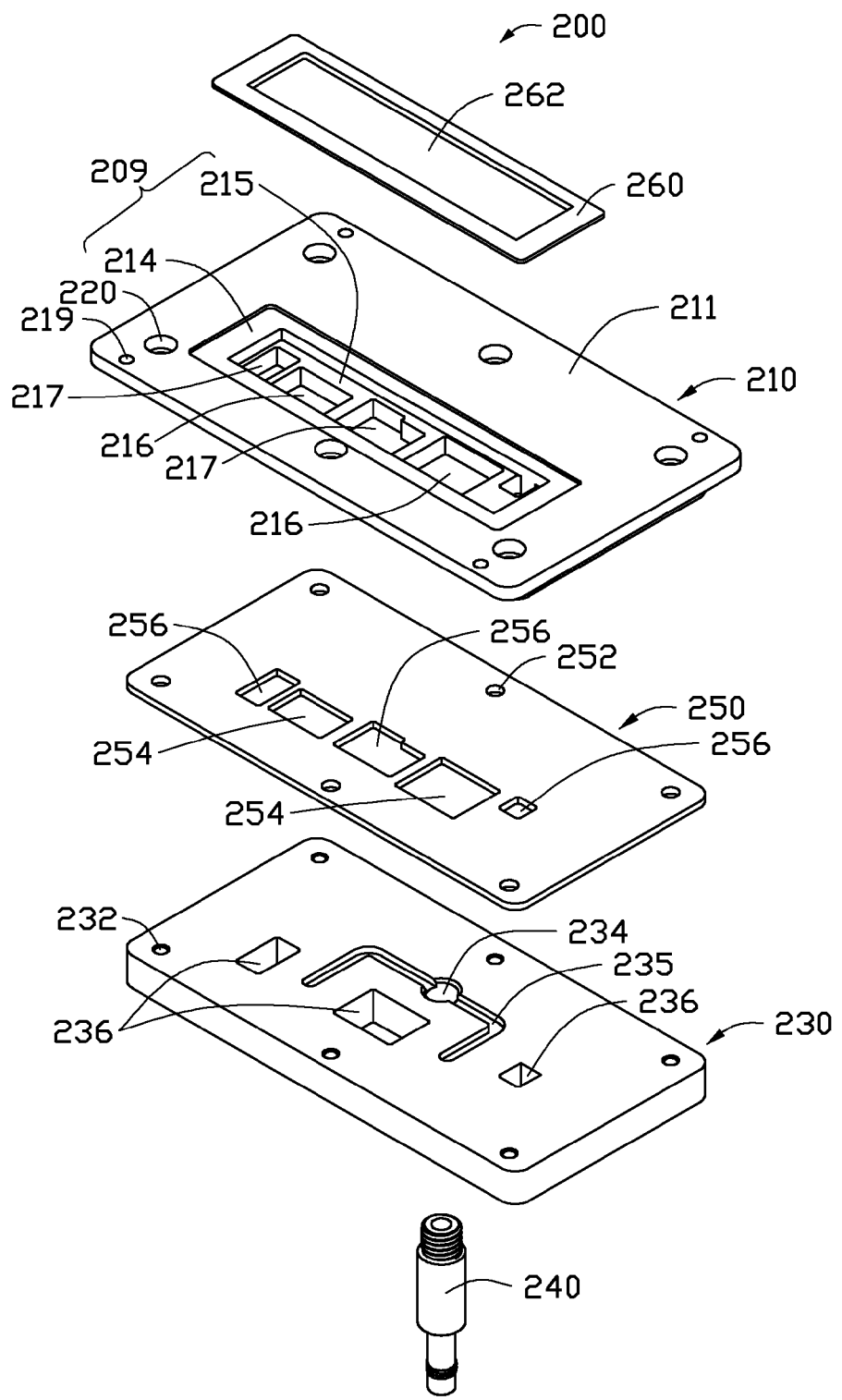
FIG. 3 is a exploded view of the cooling device of the repair apparatus in FIG. 1.
Figure 4:
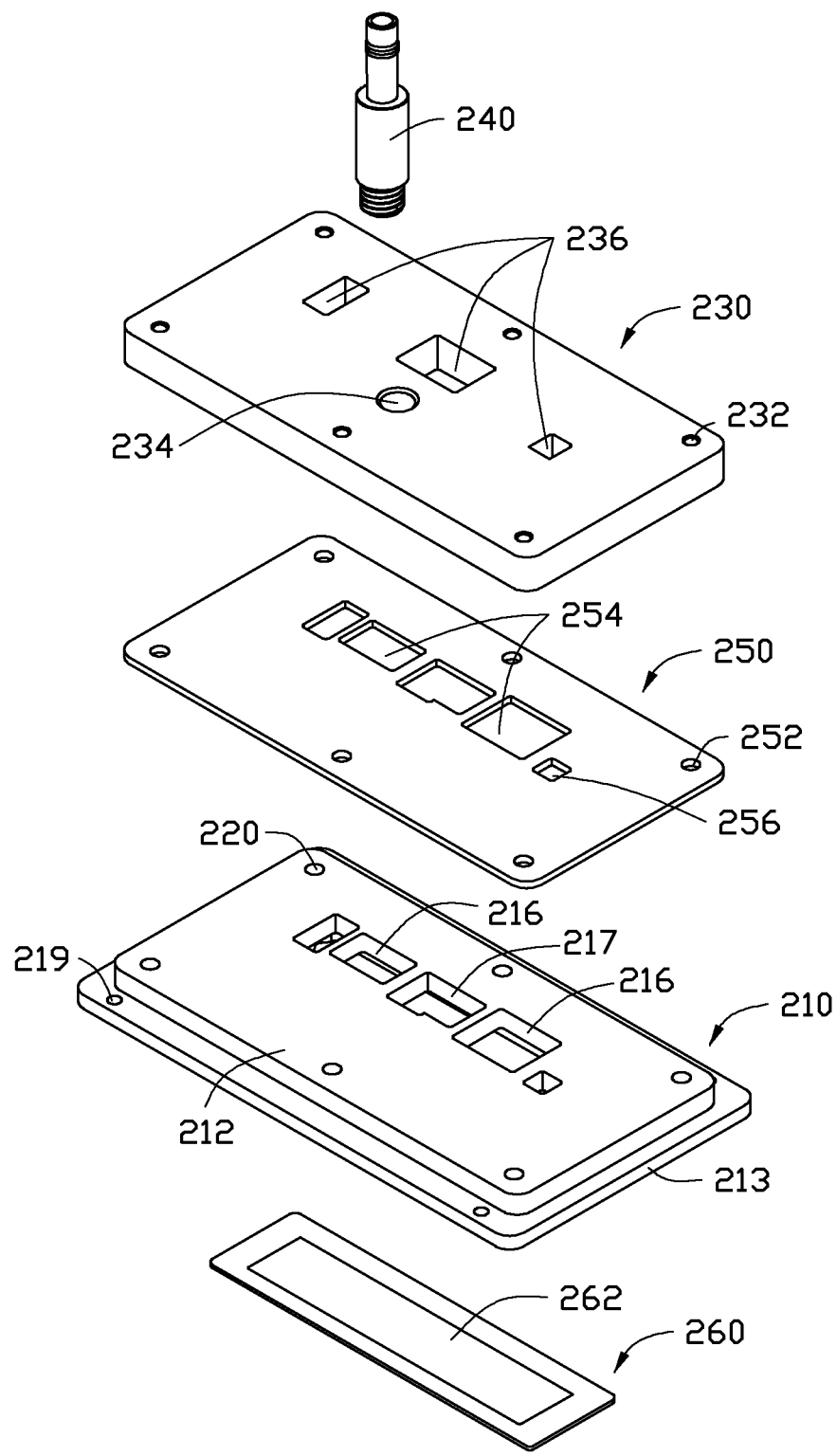
FIG. 4 is similar to FIG. 3, but viewed from another aspect.

Referring to FIGS. 3-4, the cooling device 200 can, in some embodiments, act as a working platform for repairing the printed circuit board assembly 20. The cooling device 200 includes a base 210, an airflow guide 230, a conduit 240, and a gasket seal 250. The base 210 is fixed to the cover 110 of the housing 100. The airflow guide 230 is fixed to the base 210. The gasket seal 250 is sandwiched between the base 210 and the airflow guide 230. One end of the conduit 240 is fixed to the airflow guide 230, and the other end is fixed to a gas cylinder (not shown). In the embodiment, the gas stored in the gas cylinder acts as the cooling agent of the cooling device 200 and may be compressed air. In some embodiments, the temperature of the gas stored in the gas cylinder is lower than that of the ambient air, such that heat exchange rate between the cooling medium and the circuit board assembly 20 increases. Furthermore, the cooling device 200 includes two fans 270 (see FIG. 2) mounted in the two first holes 152 respectively, to pull air out of the housing 100.

Figure 5:
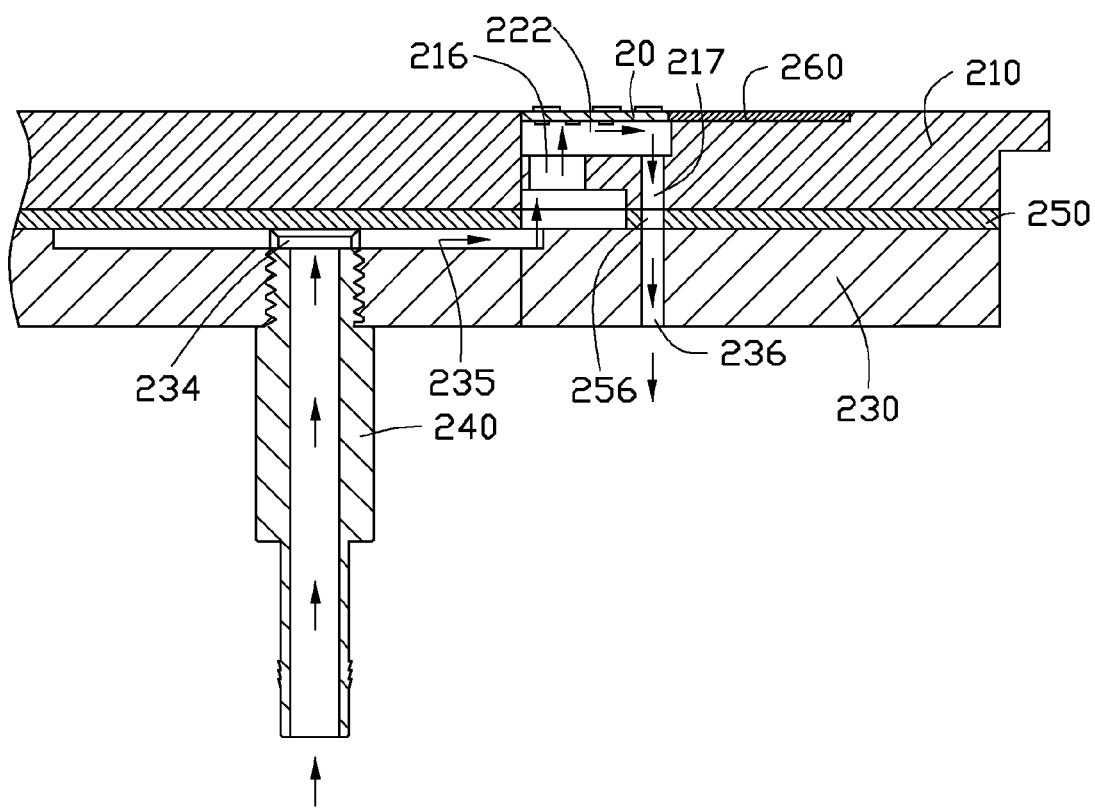
FIG. 5 is an explanatory view of a repair apparatus being used to repair the circuit board assembly in FIG. 1.

The base 210 includes an outer surface 211 and an inner surface 212 opposite to the outer surface 211. The base 210 may be made of thermally insulative material. The base 210 is received in the first recess 112. A flange 213 protrudes from the rims of the outer surface 211. The flange 213 is received in the first recess 112. The base 210 defines a chamber 209 for accommodating the circuit board assembly 20 to be repaired. The chamber 209 comprises a receiving space 214 defined on the outer surface 211 of the base 210 and a second recess 215 defined on the bottom surface of the receiving space 214. The receiving space 214 is used for receiving circuit board assembly 20. The second recess 215 communicates with the receiving space 214, such that when the circuit board assembly 20 is received in the receiving space 214, a heat exchange space 222 (see FIG. 5) for accommodating cooling medium is defined between the bottom surface of the second recess 215 and the bottom surface of the circuit board assembly 20. The bottom of the second recess 215 defines two first medium inlets 216 through which cooling medium enters into the heat exchange space 222 and three first medium outlets 217 through which heated cooling medium flows out of the heat exchange space 222. Referring further to FIG. 5, cooling air flows into the heat exchange space 222 via the first medium inlets 216, while heated air flows out of the heat exchange space 222 via the first medium outlets 217. The base 210 defines a plurality of second fixing holes 219 corresponding to the first fixing holes 116, and further defines a plurality of first holes 220 extending through the flange 213. In the embodiment, the cooling device 200 further includes a gasket 260. The gasket 260 is received in the receiving space 214. The gasket 260 defines a second opening 262. The gasket 260 surrounds the circuit board assembly 20 to seal the connection between the circuit board assembly 20 and the receiving space 214.

The airflow guide 230 may be substantially rectangular. The size of the airflow guide 230 may be equal to that of the inner surface 212 of the base 210. The airflow guide 230 defines a plurality of second holes 232 corresponding to the first holes 220 in the base 210. Securing members (not shown), such as bolts, extend through the first and second holes 220, 232 to secure the airflow guide 230 to the base 210.

The airflow guide 230 further defines a second medium inlet 234. The conduit 234 is fixed to the airflow guide 230 by threading into the second medium inlet 234. The airflow guide 230 further defines two guiding slots 235. The guiding slots 235 extend from the second medium inlet 234 and communicate with the conduit 240. The ends of the guiding slot 235 away from the second medium inlet 234 correspond to the first medium inlets 216 of the base 210 respectively. The airflow guide 230 also defines three second medium outlets 236 corresponding to the first medium outlets 217.

The gasket seal 250 may be made of thermally insulative material. The gasket seal 250 is sandwiched between the airflow guide 230 and the base 210 to secure the connection between the air-guide 230 and the base 210. The gasket seal 250 defines a plurality of third holes 252 corresponding to the first and second holes 220, 232 and two third medium inlets 254 corresponding to the first medium inlets 216. The gasket seal 250 further defines three third medium outlets 256 corresponding to the first medium outlets 217.

Referring to FIG. 5, when the gasket seal 250 is sandwiched between the airflow guide 230 and the base 210, the gasket seal 250 cooperates with the surface of the airflow guide 230 and the base 210 to define a gas flow passage (not labeled) allowing cooling airflow therethrough. In detail, the conduit 240, the guiding slot 235, the third medium inlets 254, the first medium inlets 216, the heat exchange space 222, the first medium outlets 217, the third medium outlets 256 and the second medium outlets 236 serially connect to define the gas flow passage. When a surface (hereinafter, heated surface) of the circuit board assembly is heated during repair, compressed cooling air stored in the gas cylinder flows into the cooling device 200 via the conduit 240, and then along the guiding slots 235, the third medium inlets 254 and the first medium inlets 216 into the heat exchange space 222. In the heat exchange space 222, the heat of the circuit board assembly 20 is transferred to the cooling air such that the surface thereof is cooled. The heated air flows along the first medium outlets 217, the third medium outlets 256 and finally out of the gas flow passage through the second medium outlets 236. As a result, the electronic components mounted on the surface opposite to the heated surface are protected from high temperature. Furthermore, by way of the fans 270, the heated cooling airflow out of the gas flow passage is evacuated quickly.

Accordingly, when the circuit board assembly 20 is heated during repair, the surface opposite to the heated surface can be cooled by the cooling device 200, and the electronic components soldered in the surface opposite to the heated surface are protected.

Figure 6:
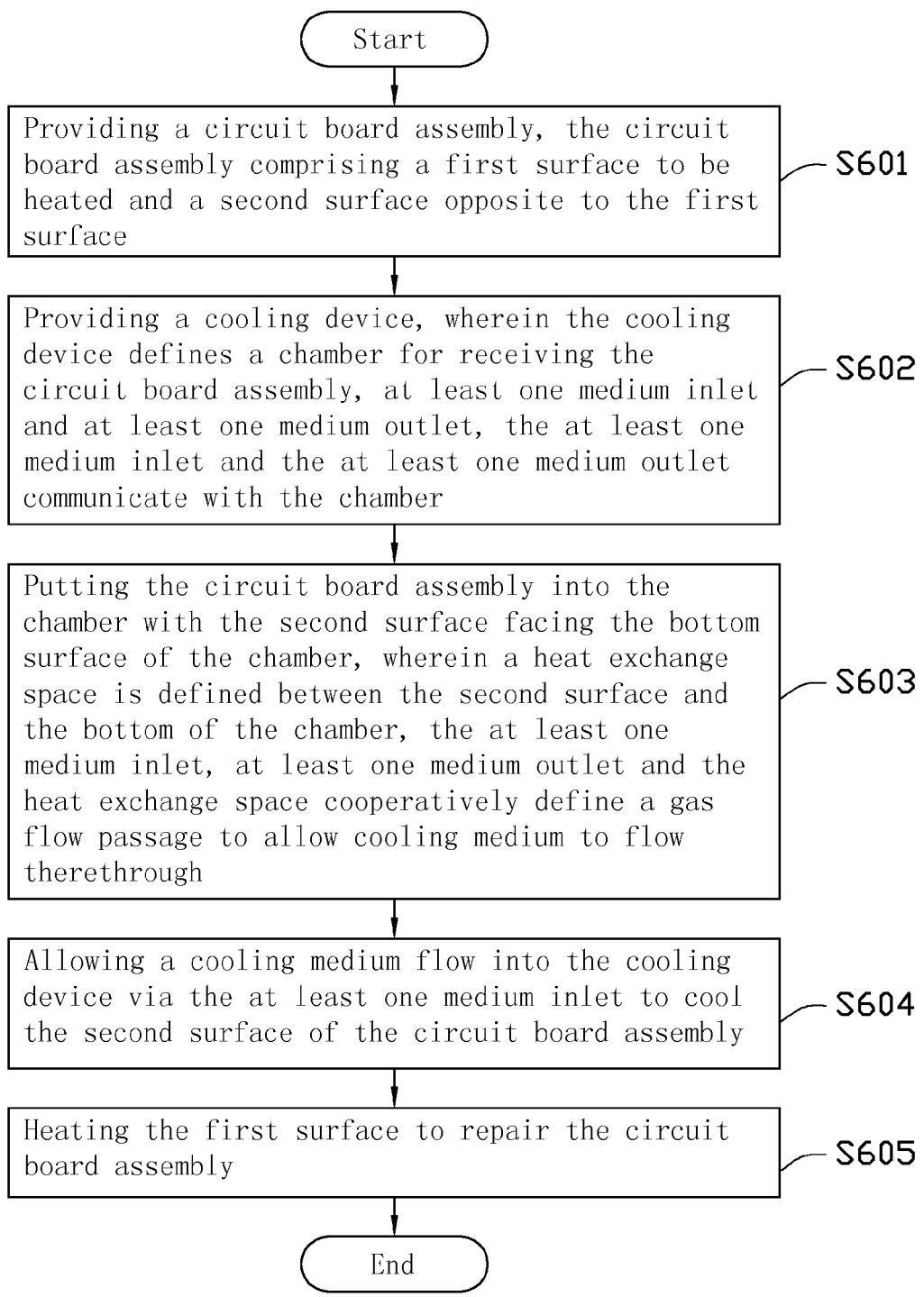
FIG. 6 is a flowchart of a method for repairing a circuit board assembly in accordance with an embodiment.

Referring to FIG. 6, a method for repairing a circuit board assembly 20 by the cooling device 200 in accordance with an embodiment includes following steps.

In step S601, a circuit board assembly 20 to be repair is provided. The circuit board assembly includes a first surface to be heated and a second surface opposite to the first surface.

In step S602, the cooling device 200 is provided. The cooling device 200 defines a chamber 209 for receiving the circuit board assembly 20, two medium inlets 216 and three medium outlets 217. The two medium inlets 216 and three medium outlets 217 communicate with the chamber 209.

In step S603, the circuit board assembly 20 is received in the chamber 209 with the second surface facing the bottom surface of the chamber 209. A heat exchange space is defined between the second surface and the bottom of the chamber 209. The two medium inlets 216 and three medium outlets 217 and the heat exchange space cooperatively define a gas flow passage to allow cooling medium to flow therethrough.

In step S604, a cooling medium flows into the cooling device 200 via the two medium inlets 216 to cool the second surface of the circuit board assembly 200. The cooling medium is compressed air, and the temperature thereof is lower than that of the ambient air the pressure of the air.

In step S605, the first surface of the circuit board assembly 20 is heated to repair the circuit board assembly 200. Because the second surface opposite to the first surface being heated is cooled by the cooling device 200, the electronic components soldered in the second surface opposite to the first surface being heated are protected.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A repair apparatus, for a circuit board assembly, the repair apparatus comprising:
    a working platform for supporting the circuit board assembly, the working platform defining a receiving space for receiving the circuit board assembly, wherein the bottom of the receiving space defines a recess, wherein when the circuit board assembly is disposed within the receiving space, a heat exchange space underside the circuit board assembly and communicating with the recess is defined;
    the work platform further defining at least one medium inlet for permitting cooling medium entering into the heat exchanging space and at least one second medium outlet for permitting heated cooling medium flowing out of the heat exchanging space;
    wherein the working platform comprises a base and an airflow guide fixed to the base, the base defines the at least one first medium inlet and the at least one first medium outlet, the at least one first medium inlet and the at least one first medium outlet communicate with the receiving space; the airflow guide defines a second medium inlet and at least one guiding slot extends from the second medium inlet, at least one end of the at least one guiding slot away from the at least one second medium inlet communicates with the at least one first medium inlet.

2. The repair apparatus of claim 1, wherein the airflow guide further defines at least one second medium outlet corresponding to the first medium outlet.

3. The repair apparatus of claim 2, wherein the at least one second medium inlet, the at least one first medium inlet, the sealed heat exchange space, the at least one first outlet and the at least one second medium outlet are serially connected to define a gas flow passage.

4. The repair apparatus of claim 3, wherein the working platform further comprises a gasket seal, the gasket seal is sandwiched between the base and the airflow guide and is used to securely seal the connection between the airflow guide and the base.

5. The repair apparatus of claim 4, further comprising at least one conduit, the conduit is coupled to the second medium inlet of the working platform and used for leading the cooling medium into working platform.

6. A method for a circuit board assembly, comprising:
    providing a circuit board assembly, the circuit board assembly comprising a first surface needs to be heated and a second surface opposite to the first surface;
    providing a cooling device, wherein the cooling device defines a chamber for receiving the circuit board assembly, at least one medium inlet and at least one medium outlet, the at least one medium inlet and the at least one medium outlet communicate with the chamber;

putting the circuit board assembly into the chamber with the second surface facing the bottom surface of the chamber, wherein the circuit board assembly seals the chamber to define a sealed heat exchange space between the second surface and the bottom of the chamber, the at least one medium inlet, at least one medium outlet and the sealed heat exchange space cooperatively define a gas flow passage to allow cooling medium flowing therethrough;

allowing a cooling medium into the cooling device via the at least one medium inlet to cool the second surface of the circuit board assembly; and heating the first surface to repair the circuit board assembly.

7. The method of claim 6, wherein the cooling medium is compressed air, and the temperature thereof is lower than that of the ambient air.

* * * * *